United States Patent
Chiang et al.

(10) Patent No.: US 8,133,777 B1
(45) Date of Patent: Mar. 13, 2012

(54) METHOD OF FABRICATING MEMORY

(75) Inventors: Lu-Ping Chiang, Hsinchu (TW);
Hsiu-Han Liao, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 13/028,187

(22) Filed: Feb. 15, 2011

(51) Int. Cl.
*H01L 21/338* (2006.01)
*H01L 21/8234* (2006.01)
*H01L 21/8238* (2006.01)
*H01L 21/4763* (2006.01)

(52) U.S. Cl. ........ 438/199; 438/587; 438/588; 438/595; 438/637; 438/672; 257/E21.433; 257/E21.577; 257/E21.585; 257/E21.626; 257/E21.627

(58) Field of Classification Search ........... 257/E21.433, 257/E21.577, E21.585, E21.626, E21.627
See application file for complete search history.

(56) References Cited

U.S. PATENT DOCUMENTS

| | | | | |
|---|---|---|---|---|
| 6,333,219 B1 * | 12/2001 | Park et al. | ...................... | 438/238 |
| 6,383,878 B1 * | 5/2002 | Huang | ........................... | 438/299 |
| 7,098,114 B1 * | 8/2006 | Syau et al. | .................... | 438/320 |
| 2003/0000923 A1 * | 1/2003 | Ko et al. | ......................... | 216/61 |
| 2007/0059888 A1 * | 3/2007 | Sukekawa | ...................... | 438/279 |
| 2011/0084325 A1 * | 4/2011 | Wang et al. | .................... | 257/296 |

* cited by examiner

*Primary Examiner* — Mohsen Ahmadi
(74) *Attorney, Agent, or Firm* — Jianq Chyun IP Office

(57) ABSTRACT

A method of fabricating a memory is provided. A substrate including a memory region and a periphery region is provided. A plurality of gates each having spacers is formed on the substrate. A plurality of openings is formed between the gates in the memory region. A first material layer is formed in the memory region to cover the gates and fill the openings. A barrier layer is formed on the substrate to cover the gates in the periphery region and the first material layer in the memory region. A second material layer is formed on the substrate in the periphery region to cover the barrier layer in the periphery region. The barrier layer covering the first material layer is removed. The first material layer is partially removed to form a plurality of second openings. Each second opening is disposed on a top of the gate in the memory region.

8 Claims, 5 Drawing Sheets

METHOD OF FABRICATING MEMORY

BACKGROUND OF THE INVENTION

1. Field of the Invention

The invention relates to a method of fabricating a memory.

2. Description of Related Art

Generally, with the gradual reduction of the size of the memory, a self-aligned contact (SAC) process is adopted to overcome the reduction in line width and prevent the misalignment of contact holes.

In the SAC process, the thickness of the spacers on the sidewalls of the gates affects the size of the contact holes formed between the gates. However, as a memory device includes a memory region and a periphery region, and the devices in the memory region and the periphery region require different thicknesses of the spacers, the process becomes more complicated. Conventionally, the first spacers are formed on the sidewalls of the gates in the memory region and the periphery region simultaneously. Afterwards, the second spacers are usually formed on the first spacers on the gates in the periphery region. Herein, for the convenience of the process, the material of the second spacers is filled into the openings between the gates in the memory region simultaneously. The second spacers in the periphery region and the material of the second spacers between the gates in the memory region are simultaneously removed after the source and drain region is formed in the substrate in the periphery region.

Nevertheless, as the openings between the gates in the memory region have a larger depth to width ratio, the removal of the material of the second spacers between the gates is difficult and the first spacers in the memory region may be damaged during the removal. Hence, the first spacers fail to provide superior electrical insulation for the gates and affect the size of the contact holes formed subsequently using the first spacers. In addition, unfavourable removal conditions damage the substrate in the periphery region and thus lead to deterioration of device characteristics.

SUMMARY OF THE INVENTION

The invention is directed to a method of fabricating a memory, such that the fabrication is simplified and the memory obtains superior device characteristics.

The invention is directed to a method of fabricating a memory. A substrate including a memory region and a periphery region is provided. A plurality of gates is formed on the substrate and a first spacer is formed on a sidewall of each of the gates. Here, a plurality of first openings is formed between the gates in the memory region. A first material layer is formed on the substrate in the memory region. The first material layer covers the gates in the memory region and fills the first openings. A barrier layer is formed on the substrate to cover the gates in the periphery region and the first material layer in the memory region. A second material layer is formed on the substrate in the periphery region to cover the barrier layer on the gates in the periphery region. The barrier layer covering the first material layer is removed. The first material layer is partially removed to form a plurality of second openings. Each of the second openings is disposed on a top of each of the gates in the memory region. A first pattern is formed in each of the second openings. A remaining of the first material layer is removed to form a plurality of contact openings in the memory region. A contact plug is formed in each of the contact openings. The first patterns are disposed between the contact plugs.

In light of the foregoing, in the method of fabricating the memory in the invention, the devices in the memory region and the periphery region are protected by the first material layer and the second material layer respectively. Therefore, when processes such as deposition, etching, and so on are performed in one of the periphery region and the memory region, the other of the two regions is prevented from being damaged, so that the spacers on the sidewalls of the gates can maintain the structures completely.

Accordingly, the spacers provide superior electrical insulation for the gates and the self-aligned contact holes are formed between two adjacent spacers, such that the memory obtains superior device characteristics.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

FIGS. 1A to 1I are schematic cross-sectional views illustrating a flow chart of a method of fabricating a memory according to an embodiment of the invention.

Figure 1A:
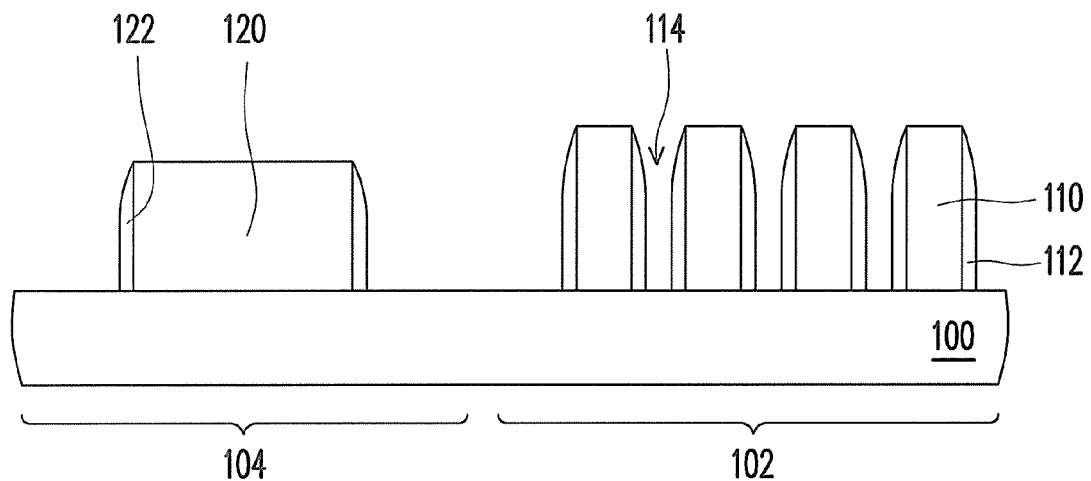
FIGS. 1A to 1I are schematic cross-sectional views illustrating a flow chart of a method of fabricating a memory according to an embodiment of the invention.

Referring to FIG. 1A, a substrate 100 is first provided. The substrate 100 includes a memory region 102 and a periphery region 104. The substrate 100 has a plurality of gates 110, 120 formed thereon. A plurality of first spacers 112, 122 is formed on a plurality of sidewalls of the gates 110, 120. Herein, a plurality of first openings 114 is disposed between the gates 110 in the memory region 102.

The substrate 100 is, for example, a semiconductor substrate such as an N-type or a P-type silicon substrate, a III-V group semiconductor substrate, and so on. A material of the gates 110, 120 includes, for instance, doped polysilicon, and a material of the first spacers 112, 122 includes, for instance, silicon nitride.

Figure 1B:
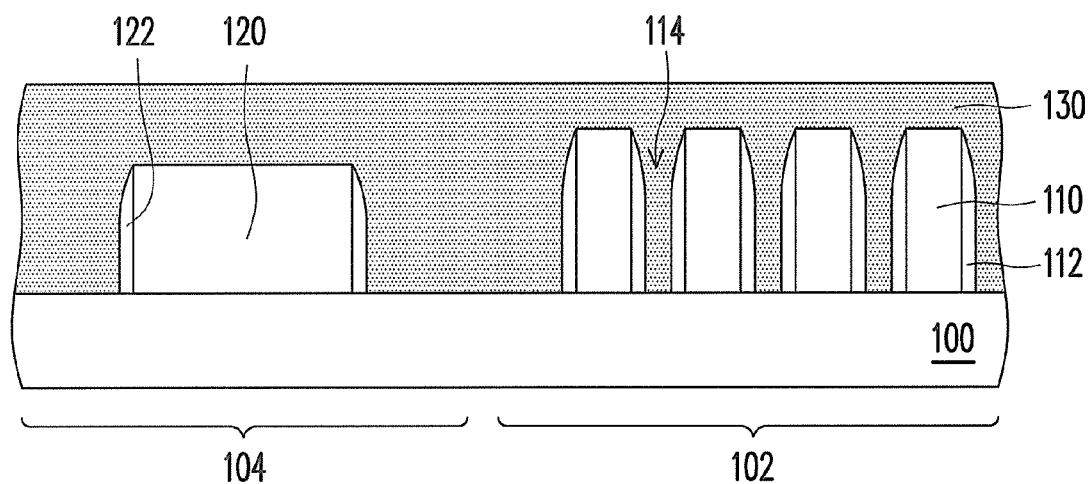

Referring to FIG. 1B, afterwards, a first material layer 130 is formed on the substrate 100. The first material layer 130 covers the memory region 102 and the periphery region 104. The first material layer 130 fills the openings 114. The first material layer 130 is, for example, a polysilicon layer, and a method of forming the first material layer is, for instance, a chemical vapor deposition (CVD) method. In the present embodiment, this step further includes performing a planarization process such as a chemical mechanical polishing (CMP) process to the first material layer 130.

Figure 1C:
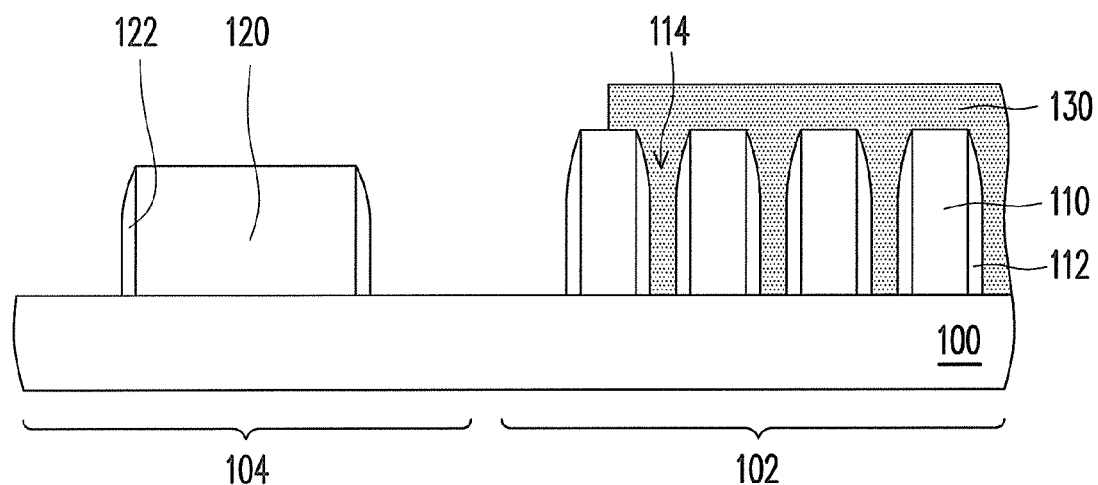

Referring to FIG. 1C, next, the first material layer 130 covering the periphery region 104 is removed to expose the periphery region 104. A method of removing the first material layer 130 is a reactive ion etch (RIE) method, for example.

Figure 1D:
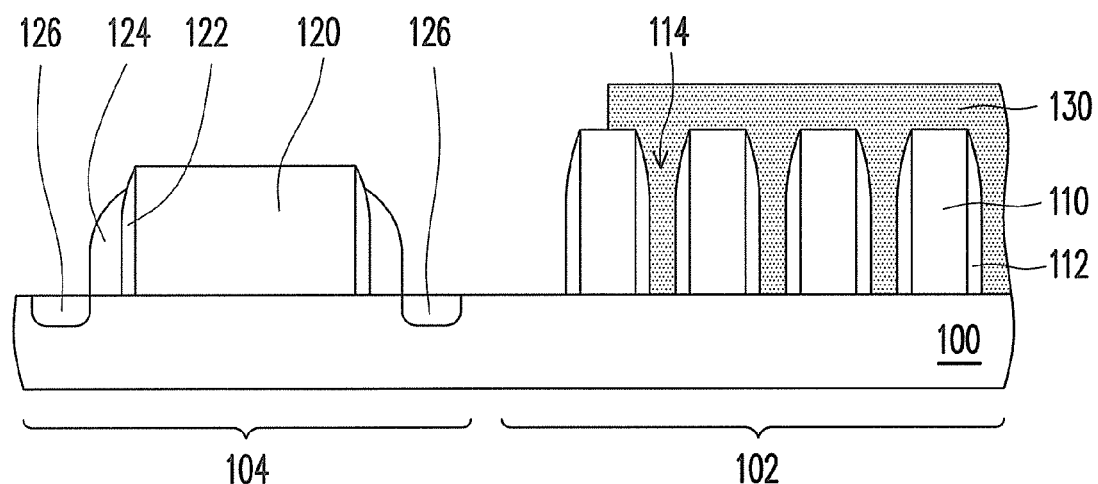

Referring to FIG. 1D, then, a plurality of second spacers 124 is formed on the first spacers 122 of the gates 120 in the periphery region 104. A method of forming the second spacers 124 can include the following steps. A spacer material layer (not shown) is formed on the substrate 100 using a method such as a CVD method. Next, the spacer material layer is partially removed with an anisotropic etching process so as to form a plurality of second spacers 124 on the first spacers 122. Herein, a material of the second spacers 124 includes silicon nitride, for instance. A method of removing the spacer material layer partially to form the second spacers includes a (RIE) method, for example.

Thereafter, the spacers 124 are adopted as a mask for performing an implantation process so as to form a drain and source region 126 on respective sides of the gates 120 in the periphery region 104. It should be noted that the second spacers 124 can be removed or not removed after the source and drain region 126 is formed on the respective sides of the gates 120 in the periphery region 104. In the present embodiment, the second spacers 124 are not removed. In other words, the step of removing the second spacers 124 is optional.

Specifically, comparing to the conventional technique, where the spacer material is filled into the openings between the gates in the memory region when forming the second spacers, or the spacer material layer in the openings are removed when the second spacers are removed, in the present embodiment, as the first material layer 130 covers the gates 110 and the first spacers 112 in the memory region 102, the formation or the removal (including processes such as deposition, etching, and the like) of the second spacers 124 does not damage the gates 110 or the first spacers 112 in the memory region 102, such that the first spacers 112 in the memory region 102 can maintain complete structures. In other words, the first material layer 130 is suitable for preventing the memory region 102 from being damaged by any process performed to the periphery region 104.

Figure 1E:
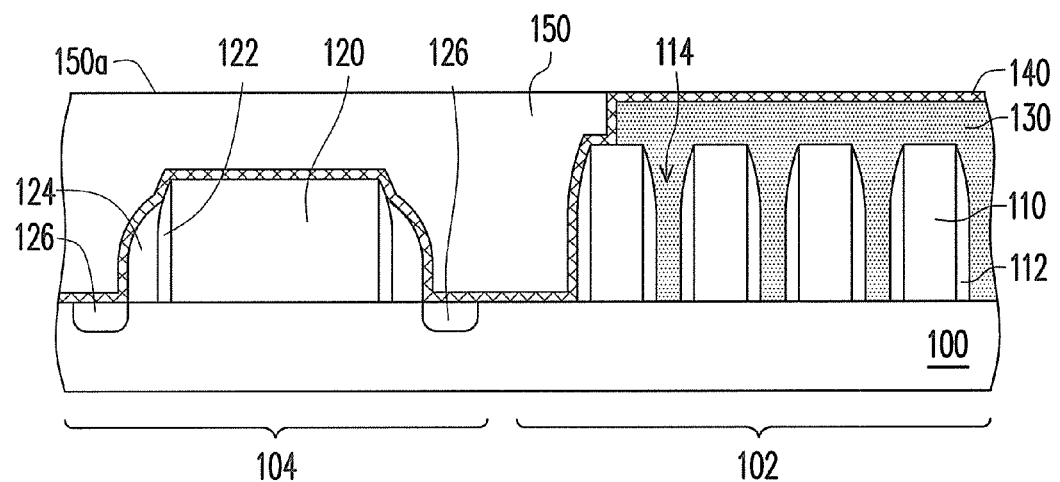

Referring to FIG. 1E, a barrier layer 140 is formed on the substrate 100 to cover the first material layer 130 in the memory region 102 and the gates 120 in the periphery region 104. In the present embodiment, the barrier layer 140, for example, covers surfaces of the gates 120, the first spacers 122, and the second spacers 124 in the periphery region 104, and the first material layer 130 in the memory region 102.

Next, a second material layer 150 is formed on the substrate 100 in the periphery region 104 to cover the barrier layer 140 on the gates 120 in the periphery region 104. In the present embodiment, the second material layer 150, for example, includes borosilicate glass or silicon oxide, and a method of forming the second material layer 150 includes a CVD method, for example. In the present embodiment, in this step, a second material layer entirely covering the periphery region 104 and the memory region 102 is formed on the substrate 100, for instance. A planarization process is then performed to the second material layer by using the barrier layer 140 on the first material layer 130 as an etch stop layer, such that a top surface 150a of the second material layer 150 and a top surface of the battier layer 140 are about the same height and are substantially on the same plane. Herein, the planarization process, for example, includes a CMP process.

Generally, when the barrier layer 140 is not formed on the first material layer 130 in the memory region 102, a top of the first material layer 130 is adopted as an etch stop layer when performing a planarization process to the second material layer 150. Hence, the second material layer 150 may be over-etched, such that the first material layer 130 has a concaved surface. However, in the present embodiment, as the first material layer 130 in the memory region 102 is covered with the barrier layer 140, when a planarization process is performed to the second material layer 150, the barrier layer 140 on the first material layer 130 is adopted as an etch stop layer. Moreover, as the barrier layer 140 usually has higher density, the second material layer 150 and the first material layer 130 are prevented from the issues aforementioned.

Figure 1F:
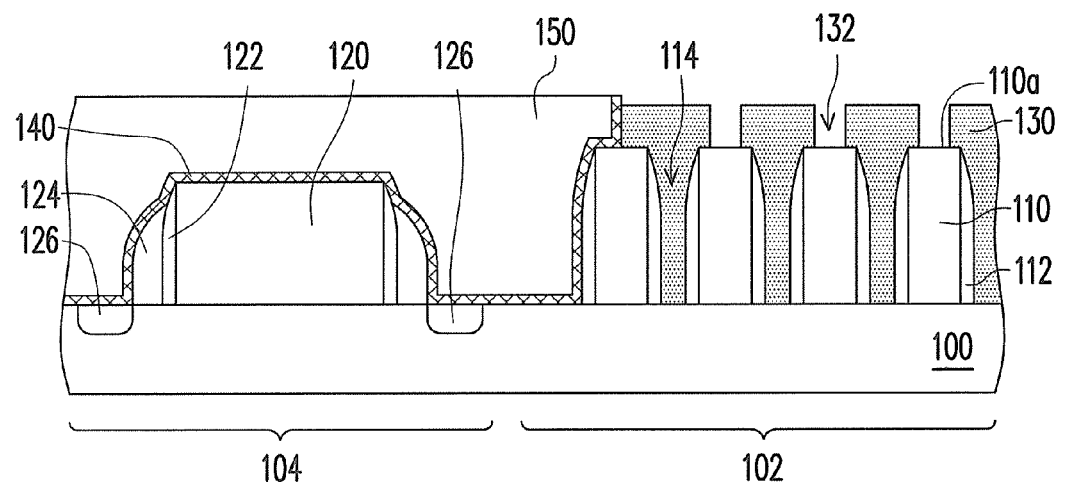

Referring to FIG. 1F, the barrier layer 140 covering the first material layer 130 in the memory region 102 is removed. A method of partially removing the barrier layer 140 is, for example, a dry-etching process.

The first material layer 130 is partially removed to form a plurality of second openings 132. In the present embodiment, a method of removing the first material layer 130 partially includes a RIE method. It should be illustrated that in the step of forming the second openings 132 in the present embodiment, as the periphery region 104 is entirely covered by the second material layer 150, etching conditions for removing the first material layer 130 partially do not affect the periphery region 104, so that the first material layer 130 can be partially removed with better etching conditions to obtain the second openings 132 with vertical profiles. For example, the selection of an etching agent does not need to consider whether the etching agent used has high selective etching ratio to the first material layer 130 and the gates 120. That is, the etching agent can be selected merely based on the view for obtaining openings with better profiles.

Figure 1G:
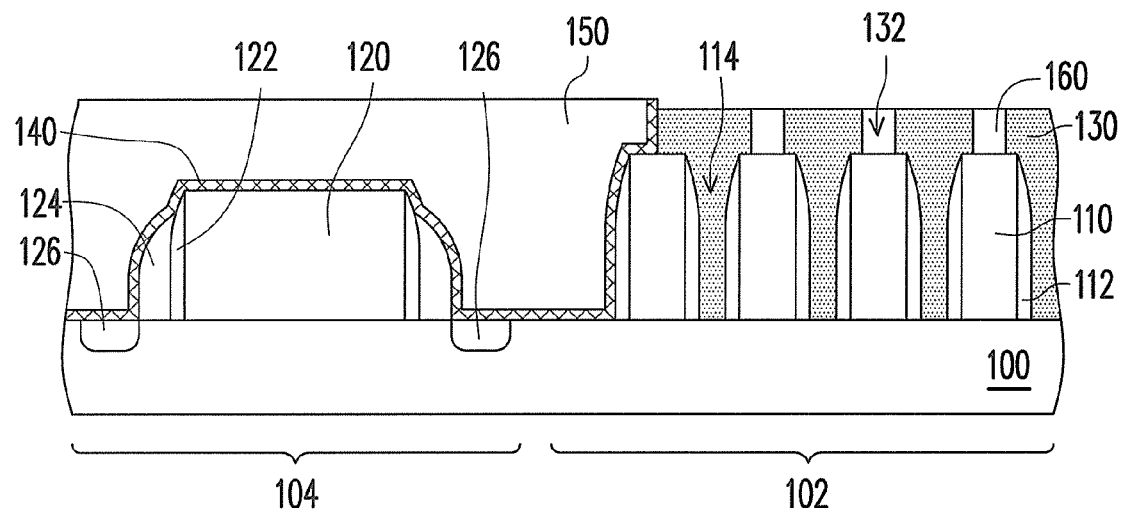

Referring to FIG. 1G, later, a first pattern 160 is formed in each of the second openings 132. A material of the first patterns 160 includes borosilicate glass or silicon oxide, for example, and a method of forming the first patterns 160 includes a CVD method, for example.

Figure 1H:
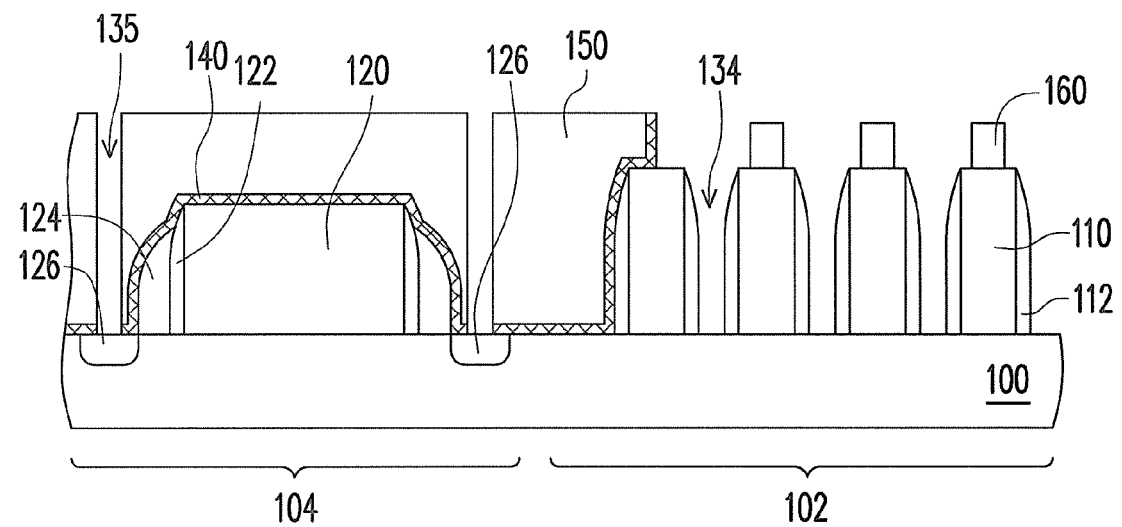

Referring to FIG. 1H, a remaining of the first material layer 130 is removed to form a plurality of contact holes 134 in the memory region 102. A method of removing the first material layer 130 includes, for example, a dry-etching method or a wet-etching method. A portion of the second material layer 150 located in the periphery region 104 is removed so as to form a plurality of contact openings 135 in the periphery region 104. Herein, the contact openings 135 expose the source and drain region 126. A method of removing the second material layer 150 includes, for example, a dry-etching method or a wet-etching method.

Figure 1I:
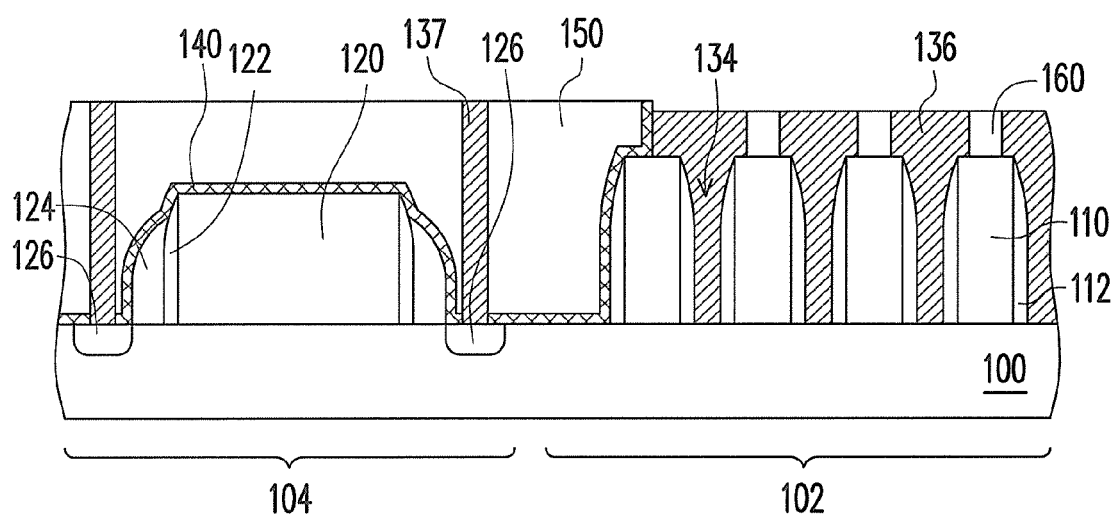

Referring to FIG. 1I, a conductor material layer is filled into the contact openings 134, 135 so as to form a contact plug 136 between two adjacent first spacers 112 and a plurality of contact plugs 137 in the periphery region 104. A material of the contact plugs 136, 137 includes, for instance, tungsten, copper, aluminum, or other suitable metal.

In the present embodiment, the memory region 102 is protected by the first material layer 130, so the processing of the periphery region 104 (such as the formation and removal of the second spacers 124) is facilitated. The barrier layer 140 on the first material layer 130 is then adopted as an etch stop layer for forming the second material layer 150 to prevent the second material layer 150 from being over-etched and the first material layer 130 from having a concaved surface. Afterwards, in a process of removing the first material layer 130 to form the first patterns 160, as the periphery region 104 is protected by the second material layer 150, the first patterns 160 have better vertical profiles. In addition, as the first spacers 112 in the memory region 102 is covered by the first material layer 130, the first spacers 112 are not affected by the processes (i.e. the formation and removal of the second spacers) performed to the periphery region 104 and can provide superior electric insulation to the gates 110. Moreover, the contact plugs 136 can be formed between the complete structures of the first spacers 112.

In summary, in the method of fabricating the memory in the invention, the devices in the memory region and the periphery region are protected by the first material layer and the second material layer respectively. Therefore, when processes such as deposition, etching, and so on are performed in one of the periphery region and the memory region, the other of the two regions is prevented from being damaged, so that the spacers on the sidewalls of the gates can maintain the structures completely. Additionally, when forming the second material layer, as the barrier layer is already formed on the first material layer, the first material layer is protected from having a concaved surface caused by the planarization process of the second material layer, such that formation of the patterns for defining the contact plugs subsequently formed in the first material layer is facilitated. Particularly, in the step of forming the patterns for defining the contact plugs, as the gates in the periphery region are covered by the second material layer, a better etching method can be selected without concerning whether the gates and the spacers in the periphery region may be damaged, such that patterns with superior profiles can be obtained. Accordingly, the spacers in the memory region and the periphery region all have complete structures, so that a self-aligned contact (SAC) hole is formed between two adjacent spacers for the memory to attain favorable device characteristics.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A method of fabricating a memory, the method comprising:
   providing a substrate including a memory region and a periphery region, wherein a plurality of gates is formed on the substrate and a sidewall of each of the gates has a first spacer, wherein the gates in the memory region have a plurality of first openings therebetween;
   forming a first material layer on the substrate in the memory region, wherein the first material layer covers the gates in the memory region and fills the first openings;
   forming a barrier layer on the substrate to cover the gates in the periphery region and the first material layer in the memory region;
   forming a second material layer on the substrate in the periphery region to cover the barrier layer on the gates in the periphery region;
   removing the barrier layer covering the first material layer;
   removing the first material layer partially to form a plurality of second openings, wherein each of the second openings is disposed on a top of each of the gates in the memory region;
   forming a first pattern in each of the second openings;
   removing a remaining of the first material layer to form a plurality of contact openings in the memory region; and
   forming a contact plug in each of the contact openings, wherein the first patterns are disposed between the contact plugs.

2. The method of fabricating the memory as claimed in claim 1, further comprising:
   forming a second spacer on the first spacer of each of the gates in the periphery region; and
   forming a source and drain region on respective sides of each of the gates in the periphery region by using the second spacers as a mask.

3. The method of fabricating the memory as claimed in claim 2, wherein the barrier layer further covers the second spacers.

4. The method of fabricating the memory as claimed in claim 1, wherein a material of the barrier layer comprises silicon nitride.

5. The method of fabricating the memory as claimed in claim 1, wherein a method of forming the second material layer comprises:
   forming a second material layer covering the substrate entirely; and
   performing a planarization process to the second material layer by adopting the barrier layer on the first material layer as an etch stop layer.

6. The method of fabricating the memory as claimed in claim 1, wherein a material of the second material layer comprises borosilicate glass or silicon oxide.

7. The method of fabricating the memory as claimed in claim 1, wherein the first material layer comprises polysilicon.

8. The method of fabricating the memory as claimed in claim 1, wherein a material of the first patterns comprises borosilicate glass or silicon oxide.

* * * * *